United States Patent
Brosnan

(10) Patent No.: US 7,473,880 B2
(45) Date of Patent: Jan. 6, 2009

(54) OPEN LOOP LASER POWER CONTROL FOR OPTICAL NAVIGATION DEVICES AND OPTICAL SYSTEMS

(75) Inventor: Michael John Brosnan, Fremont, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/679,765

(22) Filed: Feb. 27, 2007

(65) Prior Publication Data

US 2007/0195477 A1 Aug. 23, 2007

Related U.S. Application Data

(62) Division of application No. 10/778,869, filed on Dec. 12, 2004, now Pat. No. 7,209,502.

(51) Int. Cl.
*G09G 5/08* (2006.01)
*H01S 3/10* (2006.01)
*H01S 3/00* (2006.01)

(52) U.S. Cl. ............... 250/205; 372/28; 372/38.02; 372/38.04; 372/38.07; 372/38.09; 345/166

(58) Field of Classification Search .......... 250/221, 250/222.1, 205; 345/166, 167; 372/38.02, 372/38.07, 38.09, 28, 38.04
See application file for complete search history.

(56) References Cited

U.S. PATENT DOCUMENTS

| | | | |
|---|---|---|---|
| 4,884,280 A | 11/1989 | Kinoshita | |
| 5,604,757 A | 2/1997 | Liang et al. | |
| 5,638,176 A | 6/1997 | Hobbs et al. | |
| 5,953,355 A | 9/1999 | Kisly et al. | |
| 6,424,407 B1 | 7/2002 | Kinrot et al. | |
| 6,658,030 B1 | 12/2003 | Baumgartner et al. | |
| 6,792,020 B2 * | 9/2004 | Romm | 372/38.09 |
| 7,209,502 B2 * | 4/2007 | Brosnan | 372/28 |
| 7,315,558 B2 * | 1/2008 | Miller et al. | 372/38.09 |
| 7,324,086 B2 * | 1/2008 | Kong | 345/157 |
| 2004/0000698 A1 | 1/2004 | Chen | |
| 2004/0022285 A1 | 2/2004 | Romm | |

(Continued)

FOREIGN PATENT DOCUMENTS

| | | |
|---|---|---|
| DE | 19519124 | 11/1996 |
| DE | 10349609 | 7/2004 |
| EP | WO 01/15289 A2 | 3/2001 |
| EP | 1096778 | 5/2001 |
| EP | 1533686 A2 | 5/2005 |
| JP | 07073265 A | 3/1995 |

OTHER PUBLICATIONS

Examination Report dated Mar. 29, 2007 for Great Britain Application No. GB0502583.8.
Great Britain Search Report dated May 26, 2005 for Great Britain Application No. GB0502583.8.

*Primary Examiner*—John R Lee

(57) ABSTRACT

A current output of a drive signal, modulated between two current settings, is applied to a laser diode, e.g. VCSEL. The settings are selected such that laser diode's power output meets the average power and peak power limits of the eye safety standards. The drive signal having a duty cycle toggling between the two settings. The duty cycle is selected such that the average and peak power limits are met for the given upper current setting. The drive circuit may include an analog modulator or digital analog converter (DAC) for maintaining the lower and upper current settings. When the drive circuit is implemented as an integrated circuit, the DAC may be incorporated into the IC. The sensitivity of the DAC is selected to maintain the desired lower and upper current settings.

8 Claims, 9 Drawing Sheets

U.S. PATENT DOCUMENTS

2004/0112045 A1 6/2004 Gomulka
2005/0001818 A1 1/2005 Chang et al.
2005/0094154 A1* 5/2005 Baney et al. .................. 356/499
2007/0230525 A1* 10/2007 Sanders et al. ............ 372/38.02

* cited by examiner

OPEN LOOP LASER POWER CONTROL FOR OPTICAL NAVIGATION DEVICES AND OPTICAL SYSTEMS

CROSS REFERENCE TO RELATED APPLICATION

This application is a divisional application of the U.S. patent application Ser. No. 10/778,869 entitled, "Open Loop Laser Power Control in Optical Navigation," filed on Feb. 12, 2004 now U.S. Pat. No. 7,209,502, the contents of which are incorporated herein by reference in their entirety.

BACKGROUND

Products containing light emitting diodes (LEDs) or lasers that emit light in the visible or infrared range must conform to eye safety requirements, such as IEC 60825-1. If the optical flux that can impinge on a user's eye exceeds the standard, the device must be labeled an eye safety hazard, which is undesirable. This requirement applies not only during normal operation of the circuit but when predictable signal faults occur in the circuit.

FIG. 1 illustrates a prior art eye safety circuit. This simple circuit uses a fuse. When the bias current exceeds the eye safety requirement, the fuse blows. FIG. 2 illustrates another prior art eye safety circuit. This circuit is a retriggerable transistor circuit that shunts current away from the LED when the current exceeds a design threshold.

The prior art circuits detect when the LED current is higher than some preset current. However, the circuit in FIG. 1 cannot detect a fault in which the LED cathode is connected to GROUND and the fuse cannot be readily integrated onto an integrated circuit. While, the circuit in FIG. 2 can detect a fault where the LED cathode is shorted to GROUND, this circuit would be difficult to implement with a standard CMOS integrated circuit process.

As shown in FIG. 3, Kinoshita in "Semiconductor Laser Driving Device for Stabilizing the Optical Output Thereof", U.S. Pat. No. 4,884,280, issued 28 Nov. 1989, disclosed using a monitoring photodiode having an output indicative of the actual output of the laser. A comparator compares a reference signal indicative of a reference output level of the laser and the monitor photodiode signal. The comparator output signal reflects the change in the actual optical output level of the laser. An abnormal current eliminator controls the comparator output so that the signal has limited amplitude. Hence, the drive current to the laser is forcibly decreased to safe drive current levels.

Shown in FIG. 4, Kiely, et al. "Semiconductor Laser Package With Power Monitoring System", U.S. Pat. No. 5,953,355, issued 14 Sep. 1999, disclosed a VCSEL that includes a power monitoring system integrated into the cap of the VCSEL package instead of a monitoring photodiode. Similar to Kinoshita, the output of the monitoring system is used control the drive current to the laser.

SUMMARY

In the present invention, a drive signal having a current output that is modulated between two current settings is applied to a laser, e.g. VCSEL. The two current settings are selected such that the power output of the laser meets the average power and peak power limits of the eye safety standards.

In an embodiment, the drive circuit provides a drive signal having a duty cycle toggling between the two current settings such that the power of the drive signal is below the average power limit of the eye safety level standards. The lower current setting is set to be the minimum drive signal for a laser. The duty cycle is selected such that the average and peak power limits are met for the given upper current setting. For example, the lower current setting may provide a power slightly below the average power limit while the upper current setting may provide a power slightly above the average power limit. A 50% duty cycle could be applied.

The drive circuit may include an analog or digital means for maintaining the lower and upper current settings. When the drive circuit is implemented as an integrated circuit (IC), a digital-to-analog converter (DAC) may be incorporated into the IC. The resolution of the DAC is selected to maintain the desired lower and upper current settings.

To determine the setting for the laser, the following steps may be taken. The laser is sequenced through a series of current settings. Two of the current settings are selected such that the power output of the laser meets both the average power limit and the peak power limit.

The drive circuit may be incorporated into an optical navigation device. In an illustrative example, an optical mouse sensor includes tile drive circuit having a current output modulated between two current settings. The optical navigation device further includes the laser. In operation a modulated drive signal is applied to a laser. The laser beam is projected at a surface. A reflected signal that indicates positional data is received from the surface. The steps of projecting and receiving are repeated. Periodically, the reflected signals are compared to determine differences in positional data.

DETAILED DESCRIPTION

The present invention is directed towards maintaining laser power output between two levels. When used in an optical navigation device, the first level is the minimum power needed to provide good tracking while the second level is the maximum power output allowed by current eye safety standards, e.g. IEC 60825-1 or ANSI Z136.1. A fixed current drive with linear temperature compensation circuit provides current to a vertical cavity surface-emitting laser (VCSEL). The temperature compensation slope is selected to match average VCSEL characteristics, e.g. +0.25%/degree C. The fixed current at room temperature needs to be within 1 or 2% of the ideal value to optimally maintain the power window over temperature.

In the present invention, a drive signal having a current output that is modulated between two current settings is applied to a laser, e.g. VCSELs, edge emitting laser diodes, super-resonant cavity LEDs, high efficiency LEDs, and any semiconductor-based light source. The two current settings are selected such that the power output of the laser meets the average power and peak power limits of the eye safety standards.

Figure 1:
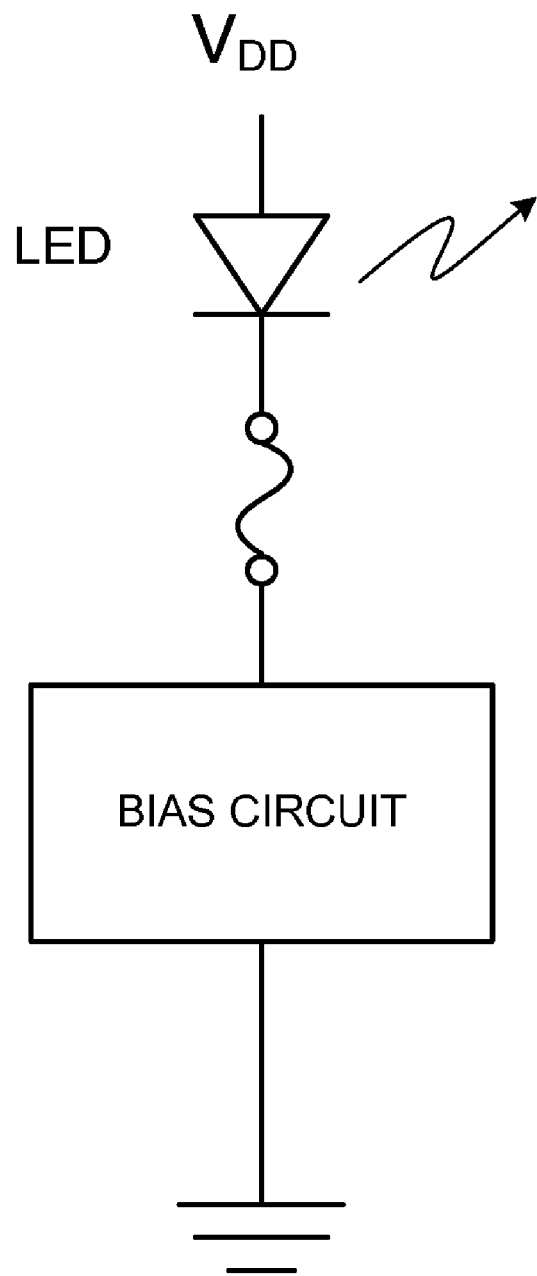
FIG. 1 illustrates a prior art eye safety circuit.
Figure 2:
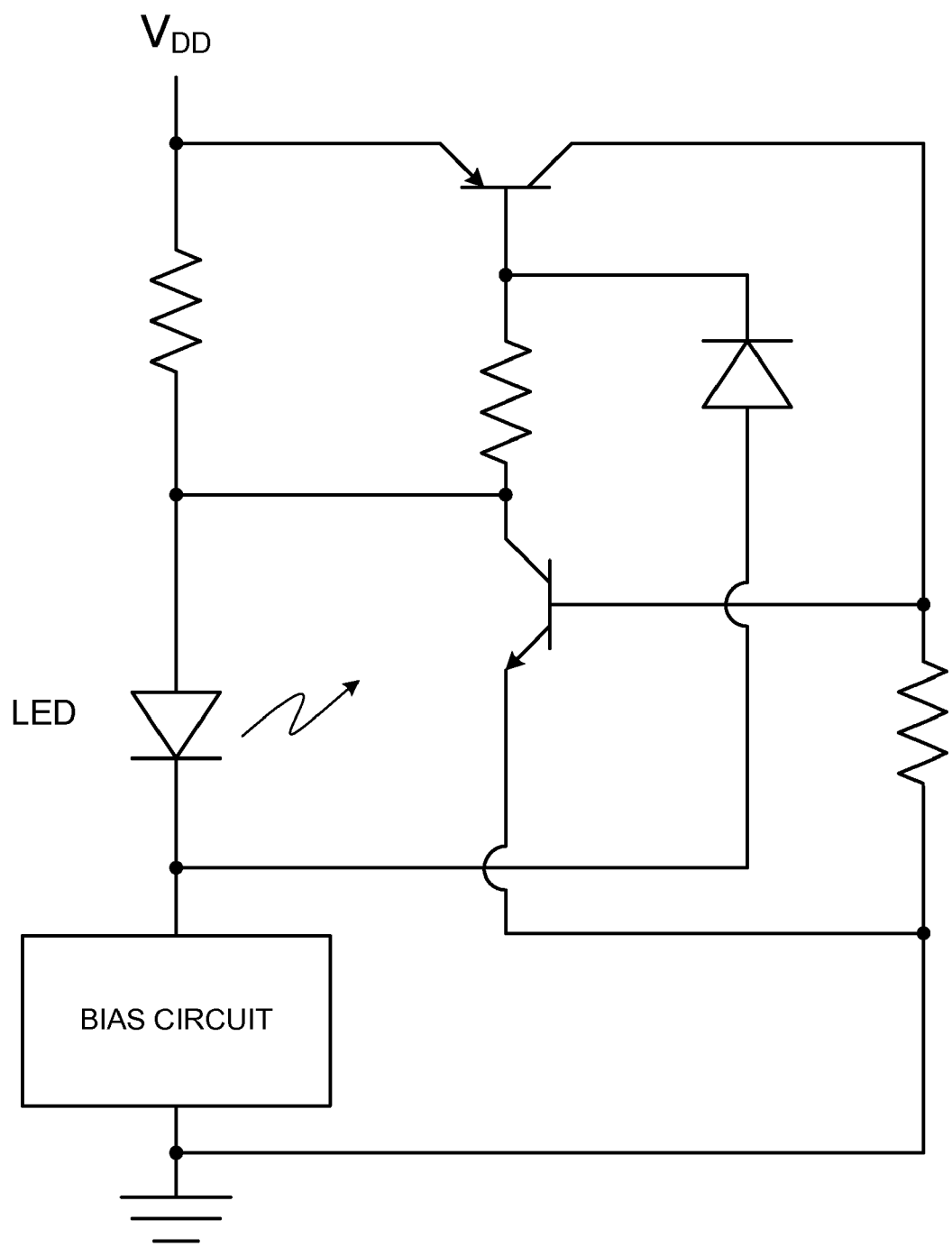
FIG. 2 illustrates another prior art eye safety circuit.
Figure 3:
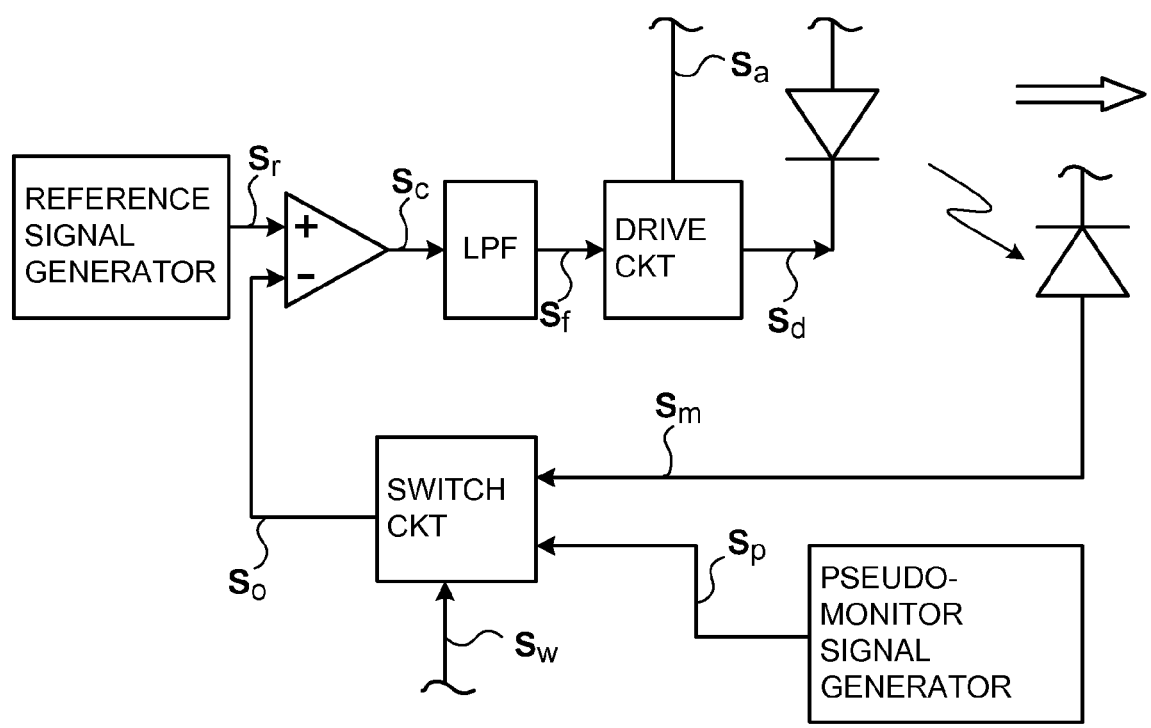
FIG. 3 illustrates a prior art monitoring photodiode circuit for lasers.
Figure 4:
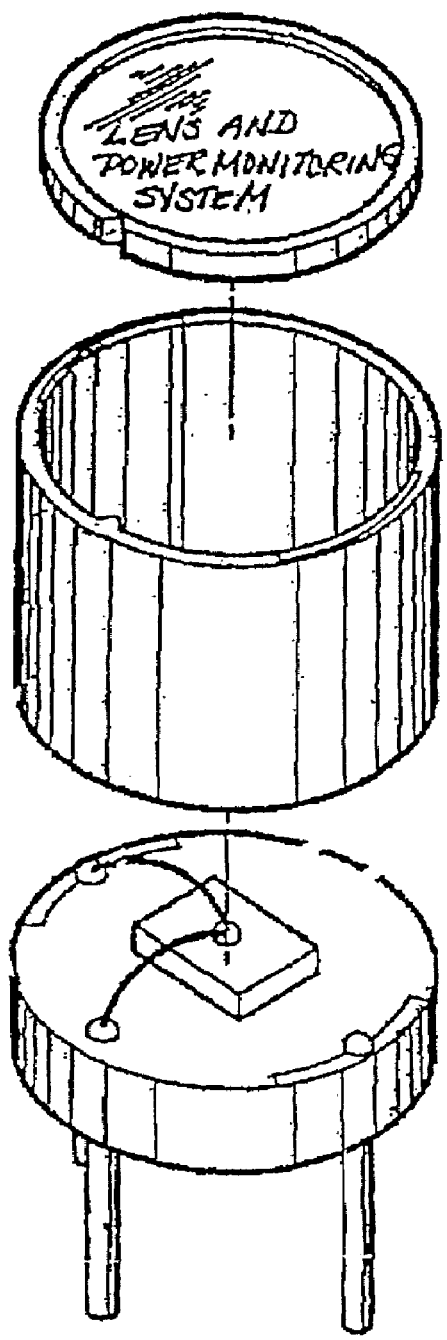
FIG. 4 illustrates another prior art power monitoring system for lasers.
Figure 5:
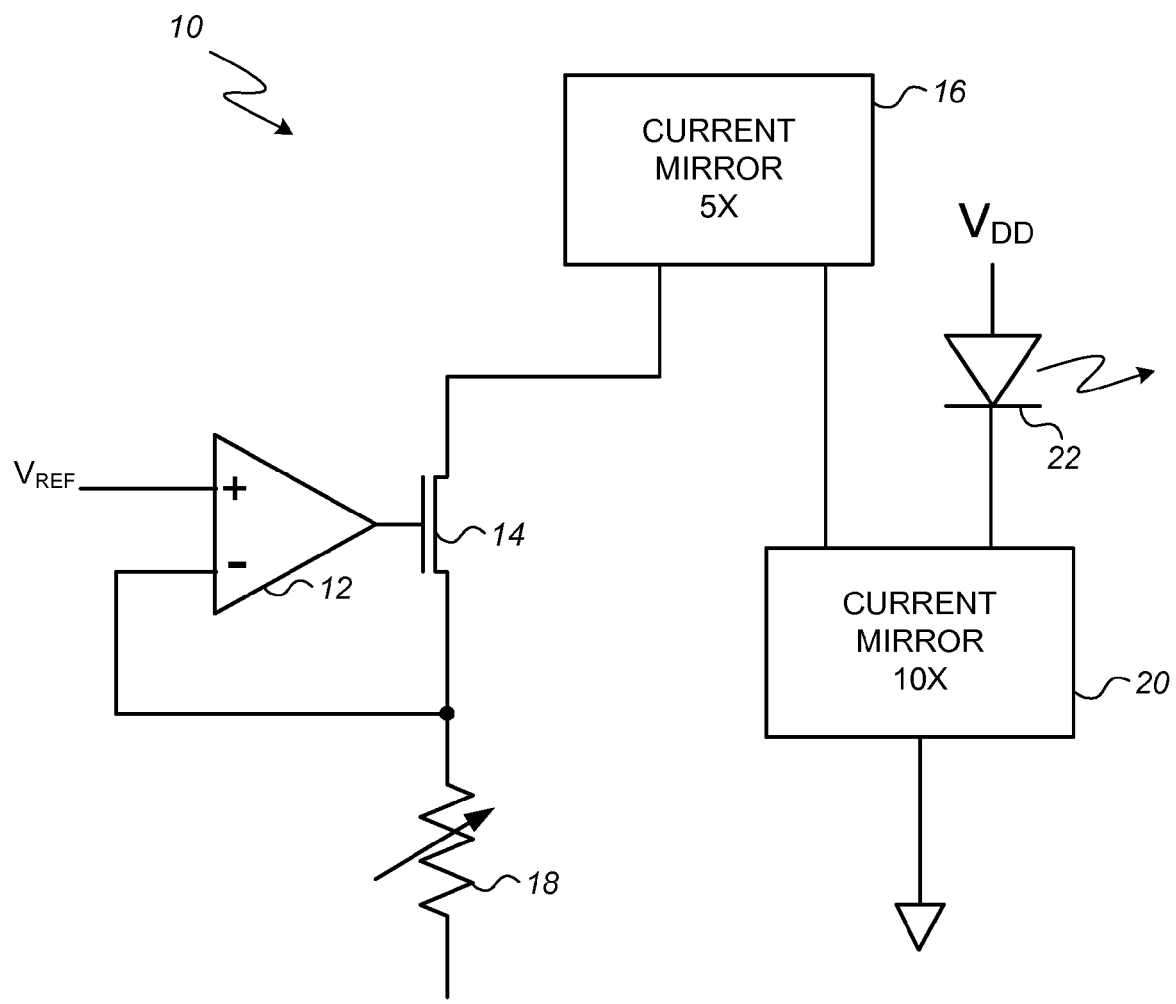
FIG. 5 illustrates an embodiment of the present invention.

FIG. 5 illustrates an embodiment of the system 10 according to the present invention. An operational amplifier 12 receives on a reference signal Vref on a positive input. A gate of field effect transistor (FET) 14 receives the output of the operational amplifier 12 while its drain is connected to a negative input of the operational amplifier 12. A variable resistor 18 connects between the drain of the FET 14 and ground. An input of a first current mirror 16 is connected to the source of FET 14. A second current mirror 20 receives the output of the current mirror 16. A laser diode 22 connects between power Vdd and the current mirror 20.

In operation, the drive circuit provides a drive signal having a duty cycle toggling between the two current settings such that the power of the drive signal is below the average power limit of the eye safety level standards. The duty cycle is selected such that the average and peak power limits are met for the given upper current setting. For example, the lower current setting may provide a power slightly below the average power limit while the upper current setting may provide a power slightly above the average power limit. A 50% duty cycle could be applied.

In alternate embodiments, the second current mirror 20, shown in FIG. 5, may be replaced by an analog modulator (not shown) or DAC for maintaining the lower and upper current settings. The resolution of the DAC is selected to maintain the desired lower and upper current settings.

To determine the current setting of the laser, the following steps may be taken. The laser is sequenced through a series of current settings. Two of the current settings are selected such that the power output of the laser meets both the average power limit and the peak power limit.

The drive circuit may be incorporated into an optical navigation device. In an illustrative example, an optical mouse sensor includes the drive circuit having a current output modulated between two current settings. The optical navigation device further includes the laser. In operation a modulated drive signal is applied to a laser. The modulation frequency can be high relative to duration of the navigation device electronic shutter duration (e.g. above 1 MHz). The modulation frequency can also be low relative to the frame rate of the navigation device (for example changing once every 2 to 32 frames). The laser beam is projected at a surface. A reflected signal is received from the surface, the signal indicates positional data. The steps of projecting and receiving are repeated. Periodically, the reflected signals are compared to determine differences in positional data.

Figure 6A:
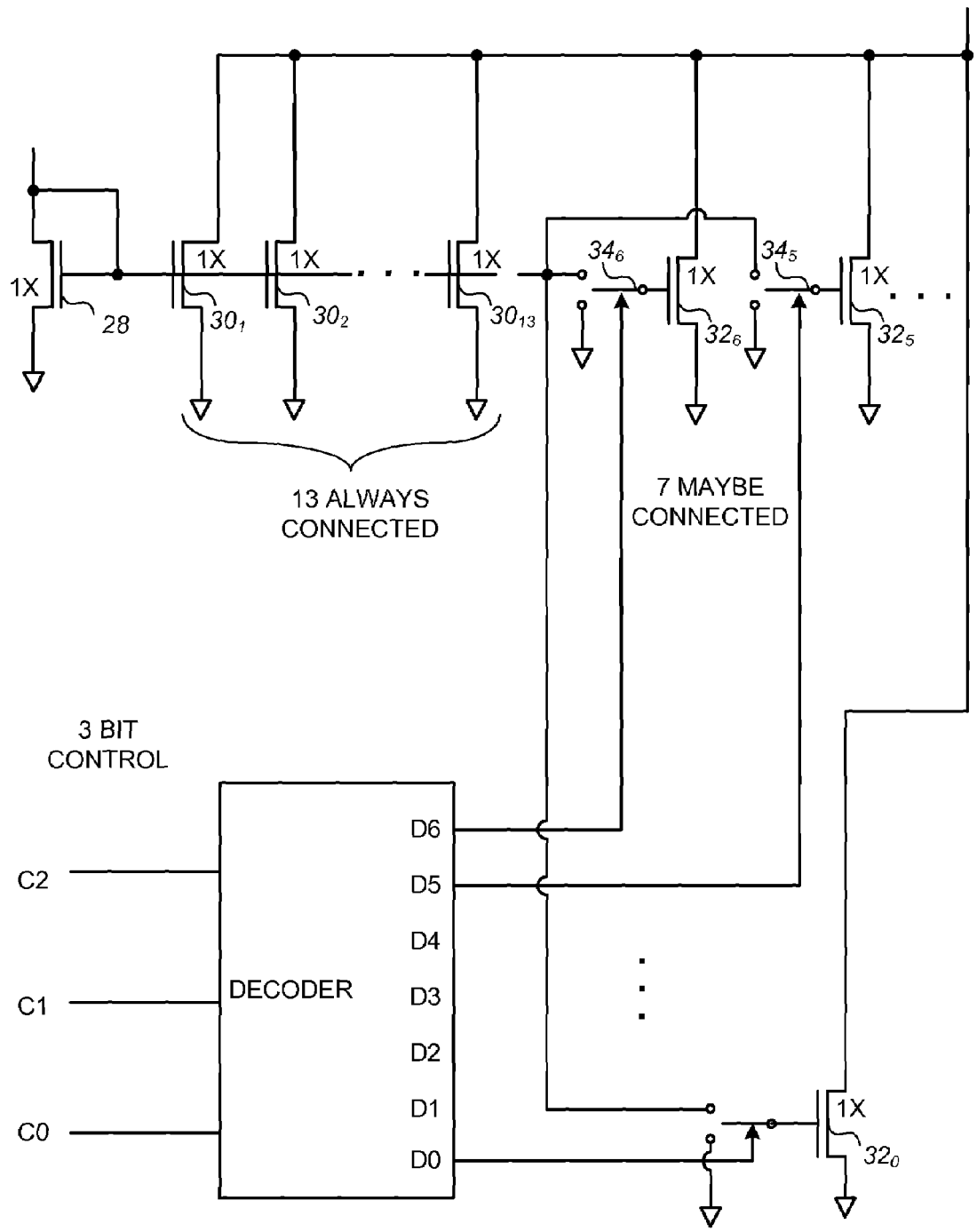
FIGS. 6A-B illustrate embodiments of a DAC within the current mirror shown in FIG. 5.
Figure 6B:
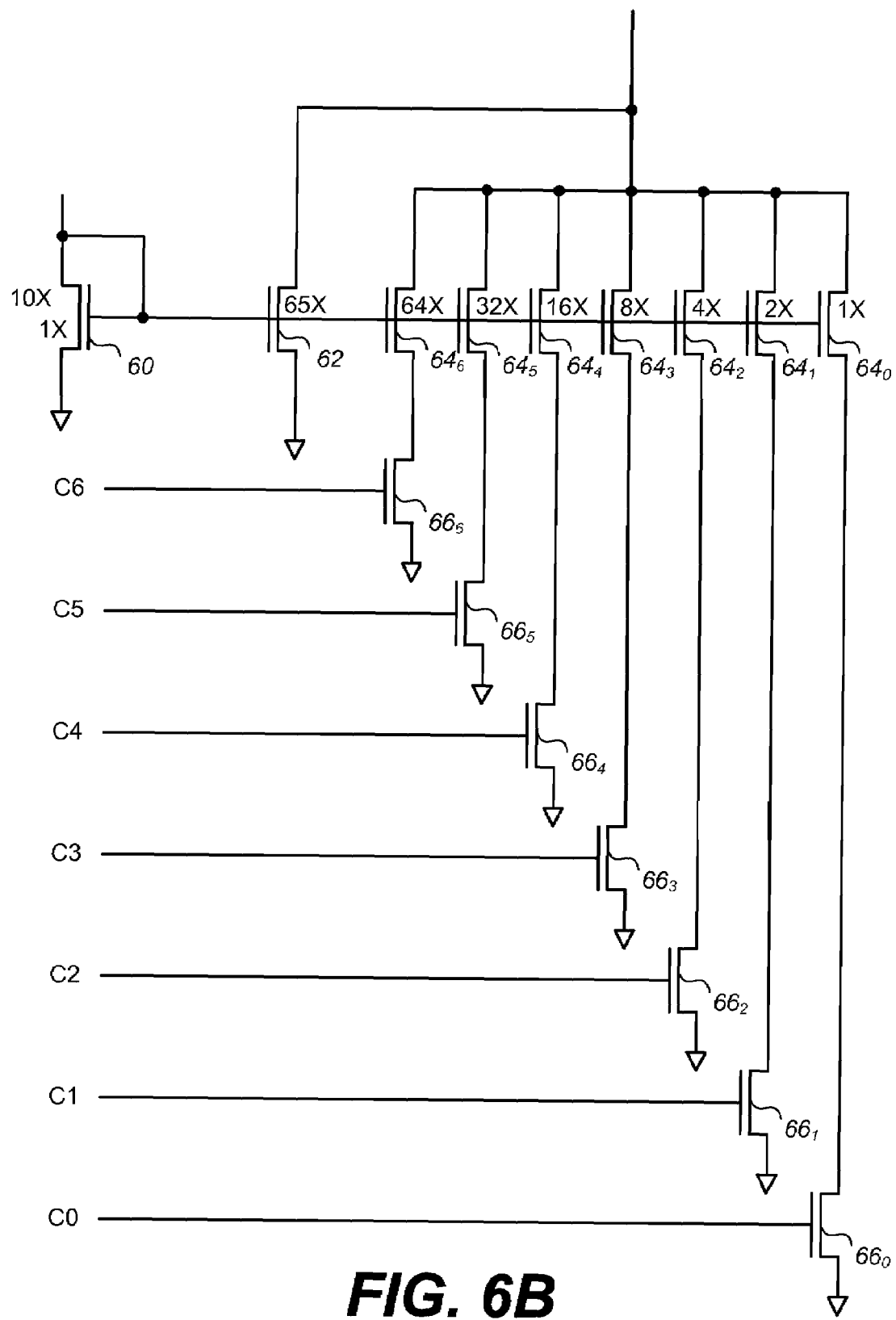

FIGS. 6A-B illustrate embodiments of a DAC replacing the current mirror 20 shown in FIG. 5.

In FIG. 6A, a 3-bit digital-to-analog converter (DAC) 26 functions as the current control. FET 28 connects between the first current mirror 16 shown in FIG. 5 and ground. The source and gate of FET 28 are tied together at node A. For a first array of FETs $30_x$, where x=1 ... 13, each FET connects between the laser diode 22 shown in FIG. 5 and ground. The gates of FETs $30_x$ are tied together at node A. FET 28 and FETs $30_x$ have the same physical dimensions. For a second array of FETs $32_y$, where y=0 ... 6, each FET connects between the laser diode 22 shown in FIG. 5 and ground. In the second array of FETs, the gate of each FET connects to a respective switch $34_y$. The poles of each switch can connect to either node A or ground. The selector of each switch connects to a respective output of a decoder.

FIG. 6B illustrates use of a 7-bit DAC provides current control. FET 60 connects between the first current mirror 16 shown in FIG. 5 and ground. The source and gate of FET 60 are tied together at node A. In place of the first array shown in FIG. 6A, a FET 62, having a width 65× that of FET 60, connects between the laser diode shown in FIG. 5 and ground.

For FETs $64_y$, where y=0, ... 6, each FET $64_y$ has a drain connected to the laser diode of FIG. 5 and a source connected to the drain of the second FET $66_y$. The source of second FET $66_y$ connects to ground. The gate of the second FET $66y$ connects to the 7 bit control digital control value C0-C6. The gates of the first FETs $64_y$ are electrically tied together at node A. The size of each FET, $64_x$ is $2^x$ that of FET 60.

As previously mentioned, the DAC may be added to an integrated circuit (IC) that controls the VCSEL. In the embodiment of FIG. 6A, control hardware provides a 3-bit value that can change the current in 5% intervals by disconnecting 0 to 7 parallel field effect transistors (FETs). By alternating between each of the 2 closest settings with these 8 choices, the time average value of current (and thus laser power) can be set with infinite precision. Each 5% step in current causes roughly a 20% change in VCSEL light output. To achieve laser power within 5% of the target, the current needs to be within ~1% of the ideal value. By varying the duty cycle of the alternation between lower and higher current, the desired average can be achieved. The tolerance may be changed by altering the resolution of the DAC, e.g. 1 bit or 8 bits.

For example, if for each group of 16 pictures that an optical navigation device takes, e.g. 16 frames, the laser current is higher for n frames and lower for 16-n frames, then average current is:

$$I_{ave} = Ilower + \frac{(Ihigher - Ilower)*n}{16}$$

When lhigher is ~5% greater than llower, the average value can be adjusted with a precision of 1/16 of 5% or 0.3%. This is sufficient for the typical laser diode's power to be within about 1.2% of the desired value at the adjustment temperature. That leaves the bulk of the power budget for residual temperature variation.

Figure 7:
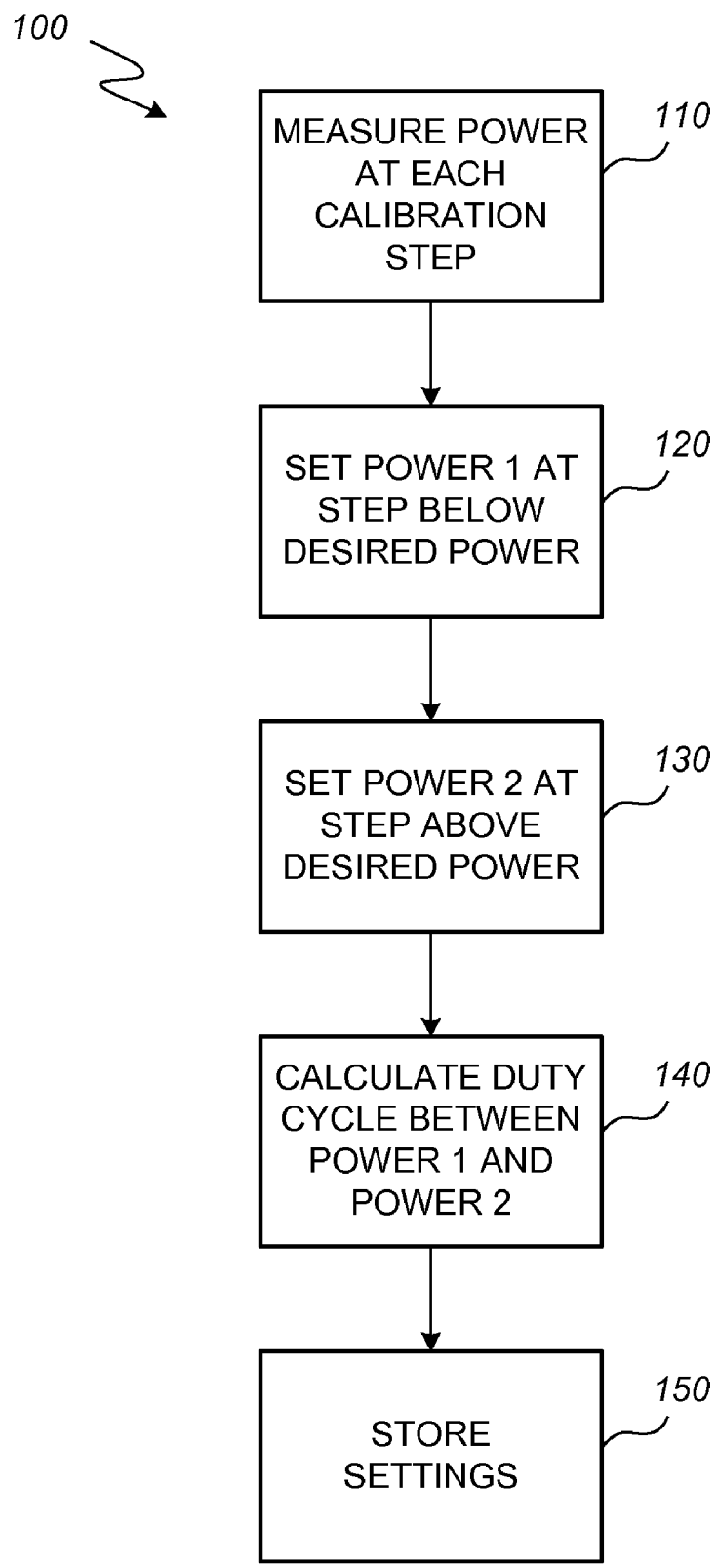
FIG. 7 illustrates a process flowchart for initial measurement 100.

FIG. 7 illustrates a process flowchart for initial measurement 100. In step 110, the power is measured at each calibration step. In step 120, set the power to be at the calibration step that provides just under the desired average power. In step 130, set the power to be at the calibration step that provides just above the desired average power. In step 140, calculate the duty cycle between the two power levels. In step 150, store the calibration settings.

The calibration settings saved in memory could be corrupted by noise events. Alternatively, to ensure safe operation even in this situation, the settings and an alternate representation (such as a one's complement value) can be saved in different memory addresses. On a regular basis, these two representations can be compared to verify integrity. When valid values are no longer available, the drive circuit can default to the lowest allowable average current (or turn off the VCSEL) to stay below the eye safety requirements.

Figure 8:
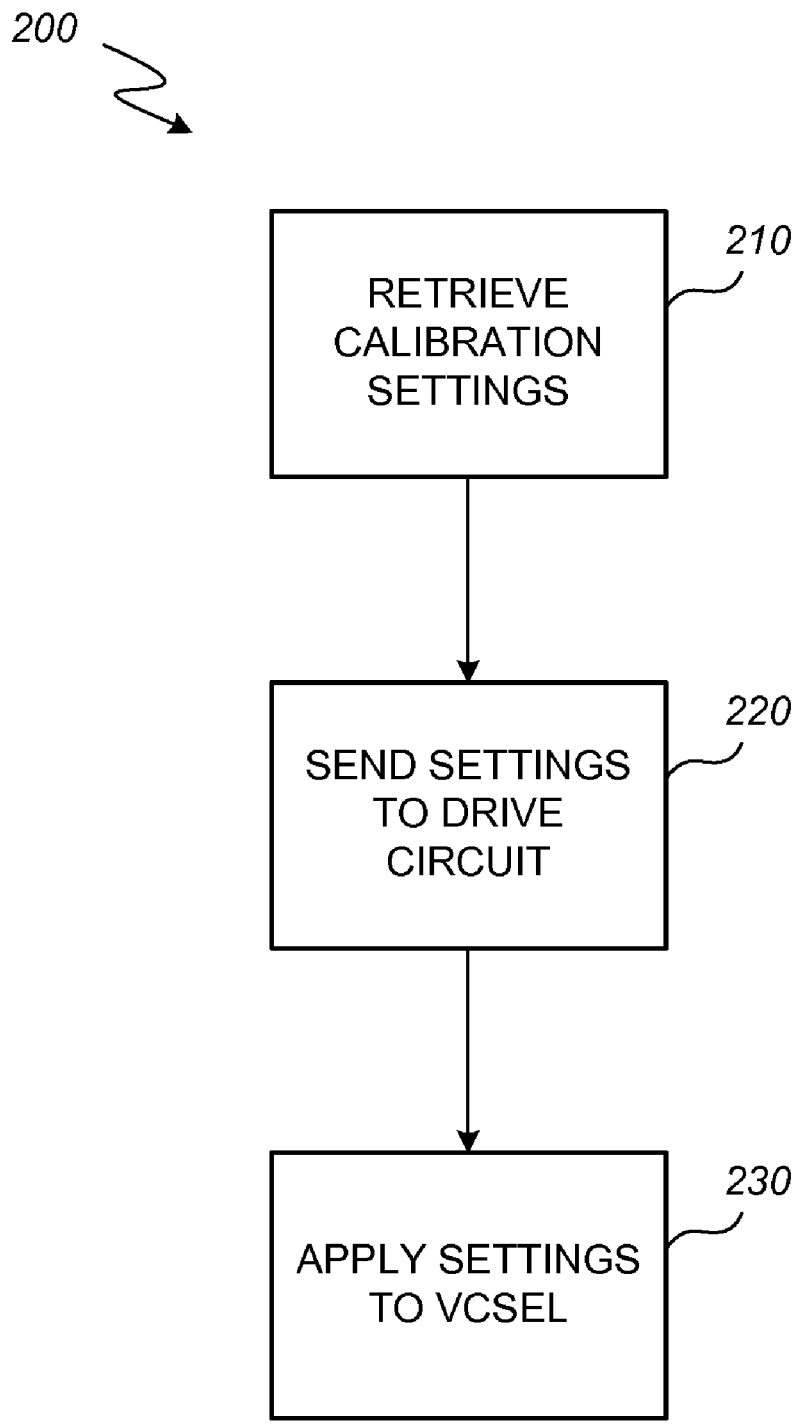
FIG. 8 illustrates a process flowchart for normal operation 200.

FIG. 8 illustrates a process flowchart for normal operation 200. In step 210, the calibration settings are retreived from memory. In step 220, the calibration settings are sent to the drive circuit. In step 230, the drive circuit applies the calibration settings. The end result is an average laser power close to target.

The invention claimed is:

1. A method comprising:
sequencing a laser through a series of current settings;
selecting a minimum current setting and a maximum current setting from the series of current settings;

modulating between the minimum current setting and the maximum current setting at a desired duty cycle to produce a drive signal; and applying the drive signal to the laser to drive the laser, wherein a difference between the maximum current setting and the minimum current setting is such that the output power of the laser can be controlled by the drive signal within about 2 percent of a desired output power over temperature.

2. A method, as defined in claim 1, wherein the output power of the laser is below a select average power limit.

3. A method, as defined in claim 1, wherein the output power of the laser is below a select peak power limit.

4. A method, as defined in claim 1, wherein the minimum current setting and the maximum current setting are adjacent current settings.

5. An optical navigation method comprising:

projecting a modulated laser beam at a surface, including:
modulating between a minimum current setting and a maximum current setting at a desired duty cycle to produce a drive signal; and applying the drive signal to the laser to drive the laser,
wherein a difference between the maximum current setting and the minimum current setting is such that the output power of the laser can be controlled by the drive signal within about 2 percent of a desired output power over temperature;

receiving a reflected signal from the surface, wherein the reflected signal indicates positional data;

repeating the steps of projecting and receiving; and comparing the reflected signals to determine differences in positional data.

6. An optical navigation method, as defined in claim 5, wherein the output power of the laser is below a select average power limit.

7. An optical navigation method, as defined in claim 6, wherein the output power of the laser is below a select peak power limit.

8. An optical navigation method, as defined in claim 6, wherein the minimum current setting and the maximum current setting are adjacent current settings.

* * * * *